United States Patent
Bertness

(10) Patent No.: US 7,999,505 B2
(45) Date of Patent: Aug. 16, 2011

(54) IN-VEHICLE BATTERY MONITOR

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 472 days.

(21) Appl. No.: 10/958,821

(22) Filed: Oct. 5, 2004

(65) Prior Publication Data

US 2005/0068039 A1 Mar. 31, 2005

Related U.S. Application Data

(60) Division of application No. 10/271,342, filed on Oct. 15, 2002, now Pat. No. 6,850,037, which is a continuation-in-part of application No. 09/960,117, filed on Sep. 20, 2001, now Pat. No. 6,633,165, which is a continuation-in-part of application No. 09/564,740, filed on May 4, 2000, now Pat. No. 6,331,762, which is a continuation-in-part of application No. 08/962,754, filed on Nov. 3, 1997, now Pat. No. 6,081,098, application No. 10/958,821, which is a continuation-in-part of application No. 10/046,659, filed on Oct. 29, 2001, now Pat. No. 6,909,287, which is a division of application No. 09/564,740, filed on May 4, 2000, now Pat. No. 6,331,762, said application No. 10/046,659 is a continuation-in-part of application No. 09/575,627, filed on May 22, 2000, now Pat. No. 6,313,608, which is a continuation-in-part of application No. 08/962,754, filed on Nov. 3, 1997, now Pat. No. 6,081,098.

(60) Provisional application No. 60/132,622, filed on May 5, 1999, provisional application No. 60/165,208, filed on Nov. 12, 1999, provisional application No. 60/175,762, filed on Jan. 12, 2000.

(51) Int. Cl.
*H02J 7/00* (2006.01)
*H02J 7/04* (2006.01)
*H02J 7/16* (2006.01)

(52) U.S. Cl. ........ 320/104; 320/106; 320/107; 320/155; 320/161

(58) Field of Classification Search .................. 320/104, 320/103, 132, 110; 203/104, 106, 107, 155, 203/161, 162, 163, 164, 148, 149
See application file for complete search history.

(56) References Cited

U.S. PATENT DOCUMENTS 2,000,665 A 5/1935 Neal ............................ 439/440
(Continued)

FOREIGN PATENT DOCUMENTS

DE 29 26 716 B1 1/1981
(Continued)

OTHER PUBLICATIONS

"Dynamic modelling of lead/acid batteries using impedance spectroscopy for parameter identification", Journal of Power Sources, pp. 69-84, (1997).
(Continued)

*Primary Examiner* — Edward Tso
*Assistant Examiner* — Alexis Boateng
(74) *Attorney, Agent, or Firm* — Westman, Champlin & Kelly, P.A.

(57) ABSTRACT

An apparatus and a method of monitoring a battery in an automotive vehicle are provided. An output is provided which can be a relative output as a function of minimum and maximum parameters of the battery.

15 Claims, 6 Drawing Sheets

U.S. PATENT DOCUMENTS

| | | | |
|---|---|---|---|
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,178,686 A | 4/1965 | Mills | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 20/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 320/150 |
| 4,126,874 A | 11/1978 | Suzuki et al. | 396/301 |
| 4,160,025 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 324/503 |
| 4,217,645 A | 8/1980 | Barry et al. | 702/63 |
| 4,280,457 A | 7/1981 | Bloxham | 123/198 |
| 4,297,639 A | 10/1981 | Branham | 324/429 |
| 4,315,204 A | 2/1982 | Sievers et al. | 322/28 |
| 4,316,185 A | 2/1982 | Watrous et al. | 320/116 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/772 |
| 4,514,694 A | 4/1985 | Finger | 324/429 |
| 4,520,353 A | 5/1985 | McAuliffe | 340/636 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 364/424.03 |
| 4,929,931 A | 5/1990 | McCuen | 340/636 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,032,825 A | 7/1991 | Xuznicki | 340/636 |
| 5,034,893 A | 7/1991 | Fisher | 701/99 |
| 5,037,778 A | 8/1991 | Stark et al. | 437/216 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |

| Patent No. | Date | Inventor | Class |
|---|---|---|---|
| 5,281,920 A | 1/1994 | Wurst | 324/430 |
| 5,295,078 A | 3/1994 | Stich et al. | 320/136 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 364/483 |
| 5,323,337 A | 6/1994 | Wilson et al. | 364/574 |
| 5,325,041 A | 6/1994 | Briggs | 320/118 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 320/136 |
| 5,369,364 A | 11/1994 | Renirie et al. | 324/430 |
| 5,381,096 A | 1/1995 | Hirzel | 324/427 |
| 5,387,871 A | 2/1995 | Tsai | 324/429 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 320/DIG. 21 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A * | 4/1996 | Koenck | 320/138 |
| 5,519,383 A | 5/1996 | De La Rosa | 340/636 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A * | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A * | 11/1996 | Crouch et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A * | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/152 |
| 5,650,937 A | 7/1997 | Bounaga | 702/6 |
| 5,652,501 A | 7/1997 | McClure et al. | 320/118 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 320/161 |
| 5,661,368 A | 8/1997 | Deol et al. | 315/82 |
| 5,675,234 A | 10/1997 | Greene | 320/DIG. 18 |
| 5,677,077 A | 10/1997 | Faulk | 429/90 |
| 5,684,678 A | 11/1997 | Barrett | 363/17 |
| 5,699,050 A | 12/1997 | Kanazawa | 340/636 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 320/128 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A * | 8/1998 | van Phuoc et al. | 320/107 |
| 5,808,469 A | 9/1998 | Kopera | 324/434 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A * | 2/1999 | Takahashi | 320/104 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,895,440 A * | 4/1999 | Proctor et al. | 702/63 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A * | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A * | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |

| Patent | Date | Inventor | Class |
|---|---|---|---|
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurie et al. | 320/112 |
| 6,072,300 A | 6/2000 | Tsuji | 320/116 |
| 6,075,339 A * | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,100,670 A | 8/2000 | Levesque | 320/150 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,211,651 B1 | 4/2001 | Nemoto | 320/133 |
| 6,215,275 B1 | 4/2001 | Bean | 320/106 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,332 B1 | 5/2001 | Conkright et al. | 340/3.1 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,271,643 B1 | 8/2001 | Becker et al. | 320/112 |
| 6,271,748 B1 | 8/2001 | Derbyshire et al. | 340/442 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertess | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,320,351 B1 * | 11/2001 | Ng et al. | 320/104 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao et al. | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,534,993 B2 | 3/2003 | Bertness | 324/433 |
| 6,544,078 B2 | 4/2003 | Palmisano et al. | 439/502 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,745,153 B2 | 6/2004 | White et al. | 702/184 |
| 6,759,849 B2 | 7/2004 | Bertness | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,842,707 B2 | 1/2005 | Raichle et al. | 702/62 |
| 6,850,037 B2 | 2/2005 | Bertness | 320/132 |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |

| | | | | | | |
|---|---|---|---|---|---|---|
| 6,998,847 | B2 | 2/2006 | Bertness et al. ............... 324/426 | JP | 63027776 | 2/1988 |
| 7,003,410 | B2 | 2/2006 | Bertness et al. ................ 702/63 | JP | 03274479 | 12/1991 |
| 7,003,411 | B2 | 2/2006 | Bertness ...................... 702/63 | JP | 03282276 | 12/1991 |
| 7,012,433 | B2 | 3/2006 | Smith et al. ..................... 324/426 | JP | 4-8636 | 1/1992 |
| 7,058,525 | B2 | 6/2006 | Bertness et al. ................ 702/63 | JP | 04095788 | 3/1992 |
| 7,081,755 | B2 | 7/2006 | Klang et al. .................. 324/426 | JP | 04131779 | 5/1992 |
| 7,106,070 | B2 | 9/2006 | Bertness et al. ............... 324/538 | JP | 04372536 | 12/1992 |
| 7,116,109 | B2 | 10/2006 | Klang .......................... 324/426 | JP | 05211724 A | 8/1993 |
| 7,119,686 | B2 | 10/2006 | Bertness et al. ............ 340/572.1 | JP | 5216550 | 8/1993 |
| 7,126,341 | B2 | 10/2006 | Bertness et al. ............... 324/426 | JP | 7-128414 | 5/1995 |
| 7,129,706 | B2 | 10/2006 | Kalley ......................... 324/426 | JP | 09061505 | 3/1997 |
| 7,272,519 | B2 | 9/2007 | Lesesky et al. ................. 702/63 | JP | 10056744 | 2/1998 |
| 7,744,149 | B2 | 6/2010 | Murray et al. ................... 307/31 | JP | 10232273 | 9/1998 |
| 2002/0004694 | A1 | 1/2002 | McLeod et al. ................ 701/29 | JP | 11103503 A | 4/1999 |
| 2002/0010558 | A1 | 1/2002 | Bertness et al. ................ 702/63 | RU | 2089015 C1 | 8/1997 |
| 2002/0030495 | A1 | 3/2002 | Kechmire ..................... 324/427 | WO | WO 93/22666 | 11/1993 |
| 2002/0041175 | A1 | 4/2002 | Lauper et al. .................. 320/106 | WO | WO 94/05069 | 3/1994 |
| 2002/0044050 | A1 | 4/2002 | Derbyshire et al. ........... 340/442 | WO | WO 96/01456 | 1/1996 |
| 2002/0050163 | A1 | 5/2002 | Makhija et al. .................. 73/116 | WO | WO 96/06747 | 3/1996 |
| 2002/0171428 | A1 | 11/2002 | Bertness ...................... 324/426 | WO | WO 97/44652 | 11/1997 |
| 2002/0176010 | A1 | 11/2002 | Wallach et al. ................ 348/362 | WO | WO 98/04910 | 2/1998 |
| 2003/0009270 | A1 | 1/2003 | Breed ............................. 701/29 | WO | WO 98/58270 | 12/1998 |
| 2003/0025481 | A1* | 2/2003 | Bertness ....................... 320/155 | WO | WO 99/23738 | 5/1999 |
| 2003/0036909 | A1 | 2/2003 | Kato .............................. 704/275 | WO | WO 00/16083 | 3/2000 |
| 2003/0088375 | A1 | 5/2003 | Bertness et al. ................ 702/63 | WO | WO 00/62049 | 10/2000 |
| 2003/0169018 | A1 | 9/2003 | Berels et al. ................... 320/132 | WO | WO 00/67359 | 11/2000 |
| 2003/0184262 | A1 | 10/2003 | Makhija ........................ 320/130 | WO | WO 01/59443 | 2/2001 |
| 2003/0184306 | A1 | 10/2003 | Bertness et al. ............... 324/426 | WO | WO 01/16614 A1 | 3/2001 |
| 2003/0187556 | A1 | 10/2003 | Suzuki ........................... 701/29 | WO | WO 01/16615 A1 | 3/2001 |
| 2003/0194672 | A1 | 10/2003 | Roberts et al. ................. 431/196 | WO | WO 01/51947 | 7/2001 |
| 2003/0214395 | A1 | 11/2003 | Flowerday et al. ............ 340/445 | WO | WO 03/047064 A3 | 6/2003 |
| 2004/0000590 | A1 | 1/2004 | Raichle et al. ............ 235/462.01 | WO | WO 03/076960 A1 | 9/2003 |
| 2004/0000891 | A1 | 1/2004 | Raichle et al. ................. 320/107 | WO | WO 2004/047215 A1 | 6/2004 |
| 2004/0000893 | A1 | 1/2004 | Raichle et al. ................. 320/135 | | | |
| 2004/0000913 | A1 | 1/2004 | Raichle et al. ................. 324/426 | | | |
| 2004/0000915 | A1 | 1/2004 | Raichle et al. ................. 324/522 | | | |
| 2004/0002824 | A1 | 1/2004 | Raichle et al. .................. 702/63 | | | |
| 2004/0002825 | A1 | 1/2004 | Raichle et al. .................. 702/63 | | | |
| 2004/0002836 | A1 | 1/2004 | Raichle et al. ................. 702/188 | | | |
| 2004/0032264 | A1 | 2/2004 | Schoch ......................... 324/426 | | | |
| 2004/0044452 | A1 | 3/2004 | Bauer et al. ..................... 703/33 | | | |
| 2004/0049361 | A1 | 3/2004 | Hamdan et al. ............... 702/115 | | | |
| 2004/0051533 | A1 | 3/2004 | Namaky ........................ 324/426 | | | |
| 2004/0054503 | A1 | 3/2004 | Namaky ........................ 702/183 | | | |
| 2004/0113588 | A1 | 6/2004 | Mikuriya et al. .............. 320/128 | | | |
| 2004/0145342 | A1 | 7/2004 | Lyon ............................. 320/108 | | | |
| 2004/0178185 | A1 | 9/2004 | Yoshikawa et al. ........... 219/270 | | | |
| 2004/0207367 | A1* | 10/2004 | Taniguchi et al. ............. 320/149 | | | |
| 2004/0227523 | A1 | 11/2004 | Namaky ........................ 324/537 | | | |
| 2004/0239332 | A1 | 12/2004 | Mackel et al. ................. 324/426 | | | |
| 2005/0017726 | A1 | 1/2005 | Koran et al. ................... 324/433 | | | |
| 2005/0043868 | A1 | 2/2005 | Mitcham ......................... 701/29 | | | |
| 2005/0102073 | A1 | 5/2005 | Ingram ............................ 701/29 | | | |
| 2005/0182536 | A1 | 8/2005 | Doyle et al. ..................... 701/29 | | | |
| 2005/0254106 | A9 | 11/2005 | Silverbrook et al. .......... 358/539 | | | |
| 2005/0256617 | A1 | 11/2005 | Cawthorne et al. ............. 701/22 | | | |
| 2006/0030980 | A1 | 2/2006 | St. Denis ........................ 701/29 | | | |
| 2006/0089767 | A1 | 4/2006 | Sowa ............................. 701/29 | | | |
| 2006/0217914 | A1 | 9/2006 | Bertness ....................... 702/113 | | | |

FOREIGN PATENT DOCUMENTS

| | | |
|---|---|---|
| DE | 19638324 | 11/1997 |
| EP | 0 022 450 A1 | 1/1981 |
| EP | 0 637 754 A1 | 2/1995 |
| EP | 0 772 056 A1 | 5/1997 |
| EP | 0 982 159 A2 | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |

OTHER PUBLICATIONS

"A review of impedance measurements for determination of the state-of-charge or state-of-health of secondary batteries", Journal of Power Sources, pp. 59-69, (1998).

"Improved Impedance Spectroscopy Technique For Status Determination of Production Li/SO$_2$ Batteries" Terrill Atwater et al., pp. 10-113, (1992).

"Search Report Under Section 17" for Great Britain Application No. GB0421447.4. (Jan. 28, 2005).

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the U.K. Patent Office for U.K. App. No. 0417678.0.

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std*. 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-223.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5.

Burr-Brown Corporation, "Design A 60 Hz Notch Filter with the UAF42", Jan. 1994, AB-071, 1994.

National Semiconductor Corporation, "LMF90-$4^{th}$-Order Elliptic Notch Filter", Dec. 1994, RRD-B30M115.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of The International Search Report or the Declaration", PCT/US03/07837.

"Notification of Transmittal of The International Search Report or the Declaration", PCT/US03/41561.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Wikipedia Online Encyclopedia, Inductance, 2005, http://en.wikipedia.org/wiki/inductance, pp. 1-5, mutual Inductance, pp. 3,4.

Young Illustrated Encyclopedia Dictionary of Electronics, 1981, Parker Publishing Company, Inc., pp. 318-319.

"A Microprocessor-Based Control System for a Near-Term Electric Vehicle", Bimal K. Bose; IEEE Transactions on Industry Applications, vol. IA-17, No. 6, Nov./Dec. 1981; 6 pages.

"DSP Applications in Hybrid Electric Vehicle Powertrain", Miller et al., Proceedings of the American Control Conference, San Diego, California, Jun. 1999; pp. 2137-2138.

* cited by examiner

IN-VEHICLE BATTERY MONITOR

The present application is a Divisional of application Ser. No. 10/271,342, filed Oct. 15, 2002, now U.S. Pat. No. 6,850,037, which is a Continuation-In-Part of and claims priority of U.S. patent application Ser. No. 09/960,117, filed Sep. 20, 2001, now U.S. Pat. No. 6,633,165, which is a Continuation-In-Part of Ser. No. 09/564,740, filed May 4, 2000, now U.S. Pat. No. 6,331,762, which claims priority to Provisional Application Ser. No. 60/132,622, filed May 5, 1999; U.S. Provisional Application No. 60/165,208, filed Nov. 12, 1999; and Provisional Application Ser. No. 60/175,762, filed Jan. 12, 2000, which is a Continuation-In-Part of application Ser. No. 08/962,754, filed Nov. 3, 1997, now U.S. Pat. No. 6,081,098 application Ser. No. 10/958,821 is also a Continuation-In-Part of Ser. No. 10/046,659, filed Oct. 29, 2001, now U.S. Pat. No. 6,909,287 which is a Divisional of Ser. No. 09/564,740, filed May 4, 2000, now U.S. Pat. No. 6,331,762, and also claims priority to Provisional Application Ser. No. 60/132,622, filed May 5, 1999, and entitled AUTOMOTIVE VEHICLE BATTERY CHARGING SYSTEM; U.S. Provisional Application No. 60/165,208, filed Nov. 12, 1999, and entitled ENERGY MANAGEMENT SYSTEM FOR AUTOMOTIVE VEHICLE; and Provisional Application Ser. No. 60/175,762, filed Jan. 12, 2000, and entitled ENERGY MANAGEMENT SYSTEM FOR AUTOMOTIVE VEHICLE, and said Ser. No. 10/046,659 is also a Continuation-In-Part of 09/575,627, filed May 22, 2000, now U.S. Pat. No. 6,313,608, which is a Continuation-In-Part of 08/962,754, filed Nov. 3, 1997, now U.S. Pat. No. 6,081,098, the contents of which are incorporated herein by reference in their entirety.

BACKGROUND OF THE INVENTION

The present invention relates to vehicles. More specifically, the present invention relates to battery monitors used to monitor batteries used in vehicles. Vehicles, both automotive and electric, typically include a storage battery. For example, automotive vehicles powered by combustion engines typically include a battery. The battery is used to power the electrical system when the engine is not running. Additionally, the engine is used to charge the battery. The engine is also used to power electrical components of the vehicle when the engine is running.

It has typically been difficult to monitor the condition of the storage battery used in such vehicles. This difficulty relates to all of the variables which are factors in determining the condition of the battery, as well as the electrical connections which are made to the battery during its use. Attempts have been made to characterize the operation of a battery and use "characterization curves" to determine battery condition. However, this technique is often quite difficult to implement because it is difficult to determine which particular characterization curve the battery may be following as well as precisely where on a particular characterization curve a battery may lie at a given moment.

This has made it difficult for a vehicle operator to accurately and in real time determine the condition of the vehicle's battery. For example, a battery at a particular moment may have just sufficient output to start the engine of a vehicle but provide no outward indication to the operator that the vehicle will not be capable of starting a second time. Further, a battery that is capable of providing sufficient power at one temperature, may fail the next morning if the temperature drops over night.

Some attempts have been made to monitor the condition of a battery using "coulomb counting" in which the amount of charge accepted by the battery or removed from the battery is monitored. However, such techniques have required a starting point (i.e., an initial value) in order to begin any attempt to monitor battery condition. Further, such techniques may not account for situations in which the battery is fully charged and any additional current going into the battery is simply lost as heat or a situation in which the battery charge decreases during periods on non-use. Thus, it would be desirable to have a battery monitor which is capable of monitoring the condition of a battery in a vehicle.

Various aspects of battering testing and related technologies have been pioneered by Midtronics, Inc. of Willowbrook, Ill. and Dr. Keith S. Champlin as shown and described in: U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat.

No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER;. U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744, 149, issued Jun. 1, 2004, entitled SYSTEM AND METHOD FOR PROVIDING STEP-DOWN POWER CONVERSION USING AN INTELLIGENT SWITCH; U.S. Pat. No. 6,759, 849, issued Jul. 6, 2004, entitled BATTERY TESTER CONFIGURED TO RECEIVE A REMOVABLE DIGITAL MODULE; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/200, 041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388, 855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/767,945, filed Jan. 29, 2004, entitled ELECTRONIC BATTERY TESTER; U.S. Ser. No. 10/783,682, filed Feb. 20, 2004, entitled REPLACEABLE CLAMP FOR ELECTRONIC BATTERY TESTER; U.S. Ser. No. 60/548, 513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823, 140, filed Apr. 13, 2004, entitled THEFT PREVENTION DEVICE FOR AUTOMOTIVE VEHICLE SERVICE CENTERS; U.S. Ser. No. 60/575,945, filed Jun. 1, 2004, entitled BATTERY TESTER CAPABLE OF IDENTIFYING FAULTY BATTERY POST ADAPTERS; U.S. Ser. No. 60/577,345, filed Jun. 4, 2004, entitled NEW METHOD FOR AUTOMATICALLY TESTING A BATTERY AND TRANSMITTING DATA TO ANOTHER MODULE IN A VEHICLE; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/870,680, filed Jun. 17, 2004, entitled ELECTRONIC BATTERY TESTER WITH RELATIVE TEST OUTPUT; U.S. Ser. No. 60/582,925, filed Jun. 25, 2004, entitled BATTERY TESTER WITH BATTERY POTENTIAL FOR RECOVERY OUTPUT; U.S. Ser. No. 10/883,019, filed Jul. 1, 2004, entitled MODULAR ELECTRONIC BATTERY TESTER; U.S. Ser. No. 60/585,700, filed Jul. 6, 2004, entitled TEST STATION; U.S. Ser. No. 60/587,232, filed Jul. 12, 2004, entitled WIRELESS BATTERY TESTER; which are incorporated herein in their entirety. U.S. Ser. No. 60/587,232, filed Jul. 12, 2004, entitled WIRELESS BATTERY TESTER; U.S. Ser. No. 10/896,835, filed Jul. 22, 2004, entitled BROAD-BAND LOW-INDUCTANCE CABLES FOR MAKING KELVIN CONNECTIONS TO ELECTROCHEMICAL CELLS AND BATTERIES; U.S. Ser. No. 10/896,834, filed Jul. 22, 2004, entitled ELECTRONIC BATTERY TESTER; U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLE; U.S. Ser. No. 10/914,304, filed Aug. 9, 2004, entitled ELECTRONIC BATTERY TESTER WITH NETWORK COMMUNICATION US Ser. No. 60/603,078, filed Aug. 20, 2004, entitled SYSTEM FOR AUTOMATICALLY GATHERING BATTERY INFORMATION FOR USE DURING BATTERY TESTING/CHARGING; which are incorporated herein in their entirety.

SUMMARY OF THE INVENTION

An apparatus and method for monitoring a battery of an automotive vehicle are provided. An electrical connection to the battery or electrical system of the vehicle. In various aspects, Kelvin connections are used for the electrical connection and may include voltage and current sensors, either with or without the Kelvin connections. A processor is used to determine a condition of the battery or of components of the vehicle.

DETAILED DESCRIPTION OF THE PREFERRED EMBODIMENTS

The present invention offers an apparatus and method for monitoring the condition of the battery and optionally controlling charging of the battery. Such a method and apparatus can be part of a general energy management system for a vehicle.

Figure 1:
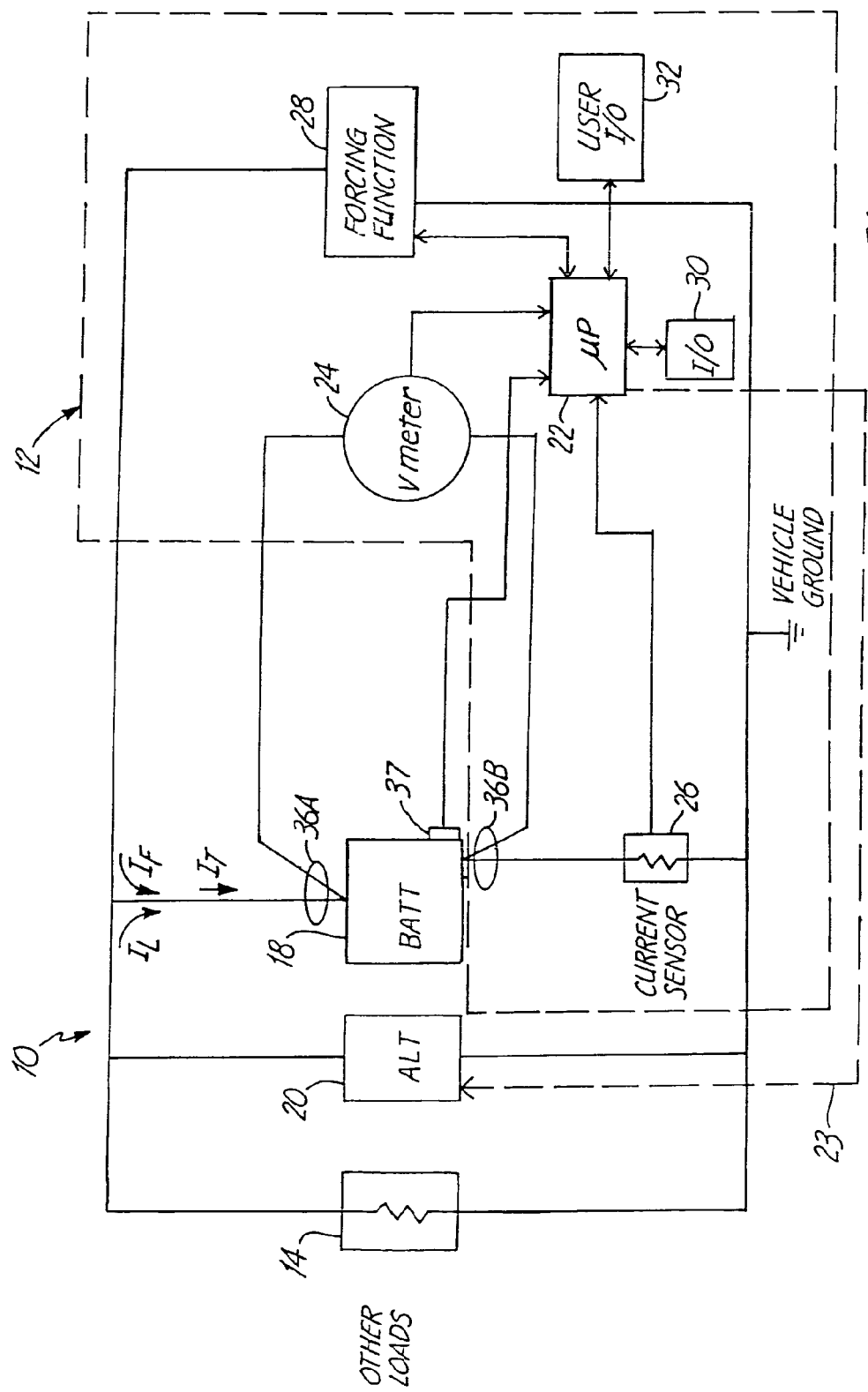
FIG. 1 is a simplified block diagram showing a battery monitor in a vehicle in accordance with one embodiment of the present invention.

FIG. 1 is a simplified block diagram showing an automotive vehicle 10 which includes a battery monitor 12 in accordance with one embodiment of the present invention. Vehicle 10 includes vehicle loads 14 which are shown schematically as an electrical resistance. A battery 18 is coupled to the vehicle load 14 and to an alternator 20. Alternator 20 couples to an engine of the vehicle 10 and is used to charge battery 18 and provide power to loads 14 during operation.

In general, automotive vehicles include electrical systems which can be powered when the engine of the vehicle is operating by a generator, or alternator. However, when the engine is not running, a battery in the vehicle is typically used to power the system. Thus, the standard generator system in a vehicle serves two purposes. The generator is used to supply power to the vehicle loads, such as lights, computers, radios, defrosters and other electrical accessories. Further, the generator is used to recharge the battery such that the battery can be used to start the vehicle and such that the battery may power the electrical accessories when the engine is not running.

One aspect of the invention includes the recognition that the condition of a battery can be determined by making an initial assumption about a parameter of the battery, and modifying the assumed battery parameter based upon certain measurements obtained from the battery during charging, discharging and/or idle periods. One specific aspect includes recognizing two battery conditions that are significant to the operator of a vehicle. The first condition is the ability of the battery to operate (i.e., "crank") the starter motor and the engine. The second condition is the ability of the battery to supply energy to electrical loads. For purposes of this aspect, indications of these conditions are calculated as relative values referred to as the Cranking State of Health (CSOH) and the Reserve State of Health (RSOH), respectively. The following description sets forth example circuitry and measurement techniques which can be used to obtain data for these determinations. In one aspect, the particular techniques used to obtain the data are not relevant to the invention and other techniques can be used.

In the embodiment illustrated in FIG. 1, battery monitor 12 includes a microprocessor 22 coupled to a voltage sensor 24, a current sensor 26 and a forcing function 28. Microprocessor 22 may also include one or more inputs and outputs illustrated as I/O 30 adapted to couple to an external databus and/or to an internal databus associated with the vehicle 10. Further, a user input/output (I/O) 32 is provided for providing interaction with a vehicle operator. In one embodiment, microprocessor 22 is coupled to alternator 20 to provide a control output 23 to alternator 20 in response to inputs, alone or in various functional combinations, from current sensor 26, voltage sensor 24 and forcing function 28. In one embodiment, the control output 23 is configured to control alternator 20 such that a nominal voltage output from alternator 20 is 12.6 volts, typical of the nominal open-circuit voltage of the battery 18. Further, microprocessor 22 can raise the output voltage from alternator 20 in accordance with an inverse relationship to the state of charge of battery 18. This can be configured such that alternator 20 only charges battery 18 when necessary, and only charges battery 18 as much as is necessary. This charging technique can increase battery life, lower component temperature of loads 14, increase the lifespan of loads 14 and save fuel. This configuration provides a feedback mechanism in which the state of charge of battery 18 is used to control the charging of battery 18. The battery monitor 12 is easily installed in a vehicle electrical system. A single shunt current sensor 26 can be inserted in one of the primary battery cables and a control line provided to allow control of alternator 20.

The control can be by simply adjusting the voltage supplied to a voltage regulator of alternator 20 to thereby control charging of battery 18. The battery monitor 12 can be a separate, self-sufficient and self-contained monitor which operates without requiring interaction with other components of the vehicle, except in some embodiment, alternator 20.

FIG. 1 also illustrates a Kelvin connection formed by connections 36A and 36B to battery 18. With such a Kelvin connection, two couplings are provided to the positive and negative terminals of battery 18. This allows one of the electrical connections on each side of the battery to carry large amounts of current while the other pair of connections can be used to obtain accurate voltage readings. Because substantially no current is flowing through the voltage sensor 24, there will be little voltage drop through the electrical connection between sensor 24 and battery 18 thereby providing more accurate voltage measurements. In various embodiments, the forcing function 28 can be located physically proximate battery 18 or be connected directly to battery 18. In other embodiments, the forcing function 28 is located anywhere within the electrical system of vehicle 10. In one aspect, the present invention includes an in-vehicle battery monitor 12 which couples to battery 18 through a Kelvin connection and further may optionally include a current sensor 26 and may be capable of monitoring battery condition while the engine of vehicle 12 is operated, loads 14 are turned on and/or alternator 20 is providing a charge signal output to charge battery 18. In one particular embodiment, the combination of the Kelvin connection formed by connections 36A and 36B along with a separate current sensor 26 connected in series with the electrical system of the vehicle 10 is provided and allows monitoring of the condition of battery 18 during operation of vehicle 10. The use of an current sensor 26 is used to provide a monitor of the total current $I_T$ flowing through battery 18.

In operation, microprocessor 22 is capable of measuring a dynamic parameter of battery 18. As used herein, a dynamic parameter includes any parameter of battery 18 which is measured as a function of a signal having an AC or transient component. Examples of dynamic parameters include dynamic resistance, conductance, admittance, impedance or their combinations. In various aspects of the invention, this measurement can be correlated, either alone or in combination with other measurements or inputs received by microprocessor 22, to the condition or status of battery 18. This correlation can be through testing of various batteries and may be through the use of a lookup table or a functional relationship such as a characterization curve. The relationship can also be adjusted based upon battery construction, type, size or other parameters of battery 18. Examples of various testing techniques are described in the following references which are incorporated herein by reference U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM.

In the specific embodiment illustrated in FIG. 1, the forcing function is a function which applies a signal having an AC (or having a time varying or transient component) to battery 18. The forcing function can be through the application of a load which provides a desired forcing function in which current is drawn from battery 18, or can be through active circuitry in which a current is injected into battery 18. This results in a current labeled $I_F$ in FIG. 1. The total current, $I_T$ through battery 18 is due to both the forcing function current $I_F$ and the current flowing through loads 14, $I_L$ Current sensor 26 is positioned to sense the total current $I_L$ One example battery dynamic parameter, the dynamic conductance (or reciprocally the battery resistance) can be calculated as:

$$\Delta G = V = \Delta I_T / \Delta V \qquad \text{EQ. 1}$$

where $\Delta V$ is the change in voltage measured across the battery 18 by voltage sensor 24 and $\Delta I_T$ is the change in total current measured flowing through battery 18 using current sensor 26. Note that Equation 1 uses current and voltage differences. In one embodiment, the change in voltage and change in current are measured over a period of 12.5 seconds and at a rate of 50 msec to thereby provide a total of 20 readings for $\Delta V$ and $\Delta I_T$ every second. The forcing function 28 is provided in order to ensure that the current through battery 18 changes with time. However, in one embodiment, changes in $I_L$ due to loads 14 or the output from alternator 20 can be used alone such that $\Delta I_T = \Delta I_L$ and the forcing function 28 is not required. In one aspect, the forcing function 28 is provided by normal or specially controlled operation of loads 14.

In one embodiment, the voltage and current sensors provide synchronized operation, within one microsecond, and are substantially immune to measurement errors due to network propagation delays or signal line inductance. Furthermore, microprocessor 22 can detect a failure of the voltage regulator and alternator 20 if the voltage output exceeds or drops below predetermined threshold levels. This information can be provided to an operator through user interface 32, for example, a "service regulator soon" indication.

A temperature sensor 37 is provided which can be coupled directly to one of the terminals of the battery 18 for measuring battery temperature. The temperature sensor 37 can be used in determining the condition of the battery, as battery condition is a function of temperature and can be used in estimating the amount of power which will be required to start the engine of the vehicle. Any type of temperature sensor can be used, for example, a thermistor, thermocouple, RTD, semiconductor or other temperature sensor. Another technique for measuring temperature is described in U.S. Pat. No. 6,137,269, issued Oct. 24, 2000 and is incorporated herein by reference.

In one embodiment, current sensor 26 comprises a resistance shunt of 250 μohms and current through the shunt is determined by measuring the voltage drop across the shunt. However, other types of current measurement techniques can also be used such as Hall Effect sensors or through an inductance probe. The change of voltage across the battery and the resultant change in current through the battery is sampled using, for example, one or more analog to digital converters. This information can be correlated to determine the total capacity, such as the total Cold Cranking Amp (CCA) capacity of the battery.

Note that during the measurement cycle, vehicle loads 14 may be applied unexpectedly causing noise to be present in the measurements. One technique which might be considered to reduce the noise is to discard those samples which are outside of a predetermined or adjustable window or are outside of the dynamic range of the analog to digital converter. However, quite unexpectedly it has been found that the accuracy of measurements can be increased by increasing the dynamic range of the analog to digital converters, at the expense of the accuracy of the samples obtained from the converter. By averaging all of the samples, even those which are statistically large or small relative to other samples, the present invention is capable of providing accurate voltage and current measurements even in a noisy environment. By averaging samples, and providing sufficient dynamic range for the analog to digital converter, no samples will be discarded and errors in the measurements will tend to cancel against other errors.

In general, the present invention uses the direct relationship between the dynamic conductance of the battery and the condition of the battery. For example, if a battery drops more than 15% below its rated capacity, microprocessor 22 can provide an output which indicates that the battery 18 should be replaced. Further, the conductance can be used to determine the charge level of the battery. Such a measurement can be augmented to improve accuracy by monitoring the total current flowing into battery 18, or out of battery 18, using current sensor 26. The voltage across the battery 18 can also be used to determine the charge used in the determination of charge level. In general, the state of charge can be determined as a function of various combinations either alone or together of battery state of health, temperature, charge balance (charge going into and out of the battery), charging efficiency and initial conditions such as the battery construction, manufacture, plate configuration or other conditions of the battery. The functional relationship can be determined by characterizing multiple batteries, iterative techniques as described below, and/or through the use of artificial intelligence techniques such as neural networks.

Figure 2:
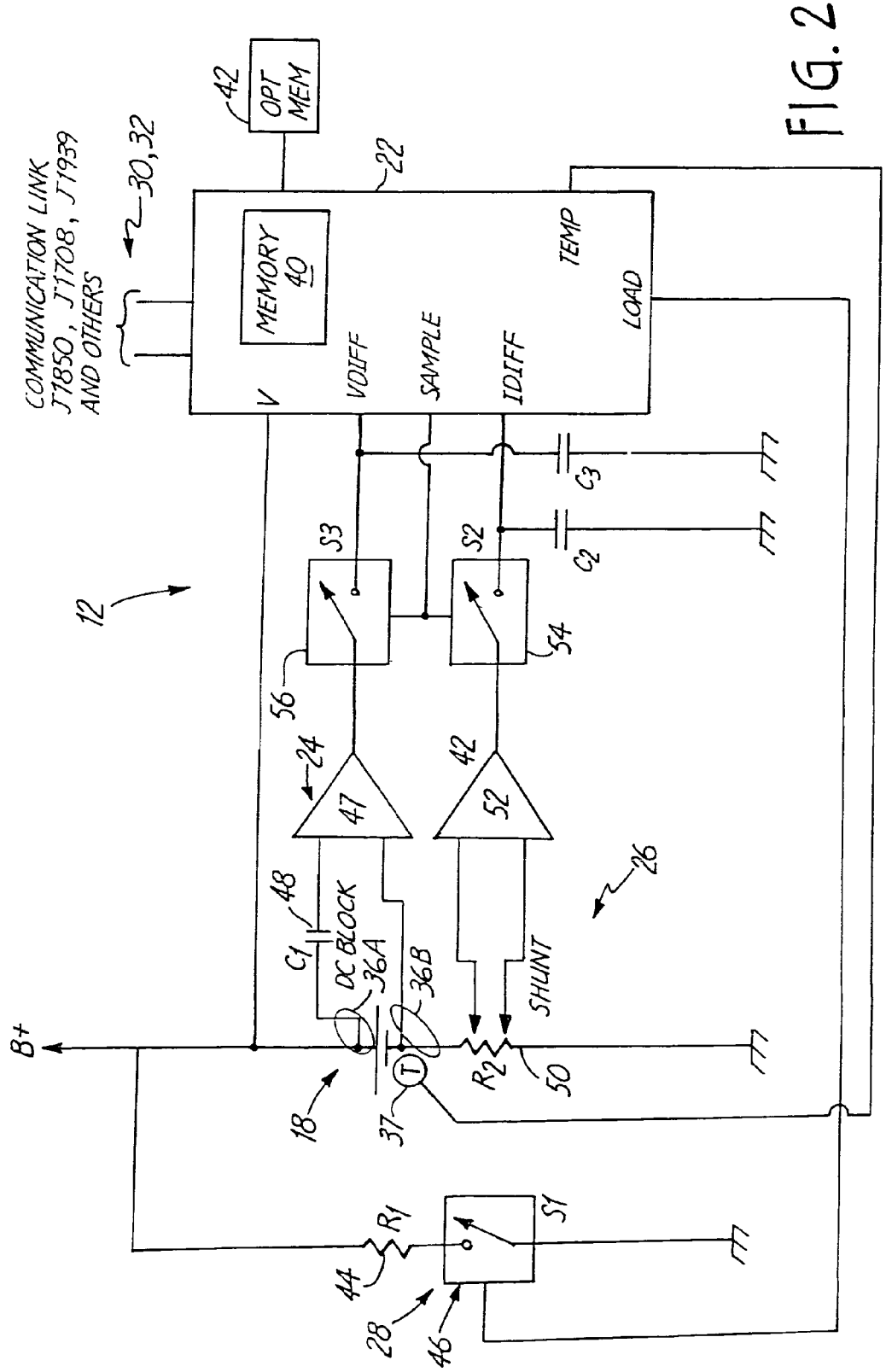
FIG. 2 is a more detailed schematic diagram showing the battery monitor of FIG. 1.

FIG. 2 is a more detailed schematic diagram of battery monitor 12. FIG. 2 shows microprocessor 22 which includes a memory 40. FIG. 2 illustrates I/O 32 with which can be, for specific examples, a communication link in accordance with various standards such as J1850, J1708, J1939, etc. Memory 40 is shown as an internal memory. However, external memory or an optional external memory 42 can also be provided. In general, memory is provided for storing programming functions, ratings, variables, etc. Microprocessor 22 can be a microcontroller or any type of digital circuitry and is not limited specifically to a microprocessor. FIG. 2 illustrates forcing function 28 in greater detail and includes a resistance $R_1$ 44 and a switch $S_1$ 46 controlled by microprocessor 22. Switch 46 can be, for example, a field effect transistor. Voltage sensor 24 is shown as including a differential amplifier 47 coupled to battery 18 through a DC blocking capacitor $C_1$ 48. Shunt 26 is illustrated as a resistance $R_2$ 50 and a differential amplifier 52. Switches $S_2$ 54 and $S_3$ 56 are positioned to selectively couple amplifiers 52 and 47, respectively, to microprocessor 22 and are actuated by a sample control line to provide data samples to microprocessor 22. An analog to digital converter can be an integral part of microprocessor 22 or it can be a separate component to digitize the outputs from amplifiers 47 and 52. Capacitors $C_2$ and $C_3$ provide sample and hold circuits.

Forcing function 28 can be formed by a resistance as illustrated in FIG. 2, or by a current sink or through an existing load of the vehicle. Switch $S_1$ 46 can be an FET, or biopolar transistor or can be a mechanical or existing switch in the automotive vehicle. Although shunt 26 is illustrated with a shunt resistance, other types of current sensors such as Hall effect sensors or cable resistance based sensors can be used. Other types of DC blocking techniques can be used to replace capacitancy $C_1$ 48 such as a DC coupled amplifier.

Figure 3:
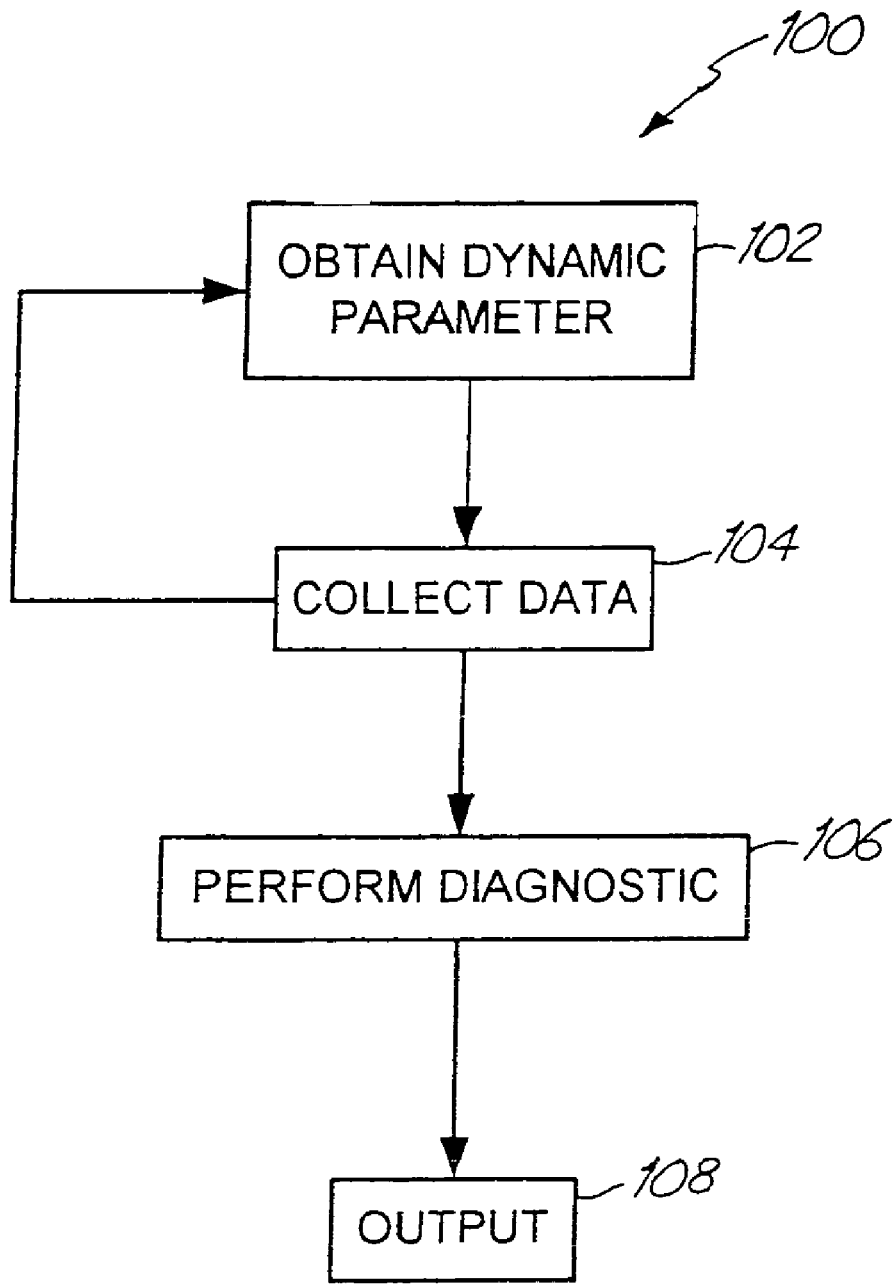
FIG. 3 is a simplified block diagram showing steps in performing diagnostics in accordance with one aspect of the present invention.

FIG. 3 is a simplified block diagram 100 showing diagnostic steps performed by microprocessor 28 in accordance with the invention. At blocks 102 and 104, the dynamic parameter(s) for the battery 18 are obtained and at block 104 data is collected. The type of data collected at block 104 can be any type of data used in determining the condition of the battery. For example, the data can be values used for $\Delta V$ and $\Delta I_T$, information related to the type of battery, etc. This information can be stored in memory 40 for subsequent retrieval by microprocessor 22. The data can be collected over any time period and during any type of engine or battery operation. At block 106, microprocessor 22 performs diagnostics or other computations based upon the data stored in memory 40. If a battery fault or impending fault is detected, an output can be provided at block 108 such as providing a "service battery soon" indication on the dash of the vehicle 10.

In one general aspect, the present invention determines the condition of the battery as a function of a stored battery parameter which is set to an initial value, modified based upon a measurement taken when the engine of the vehicle is not operating (or the battery is otherwise not being charged) and modified by a measurement taken when the engine of the vehicle is operating (or the battery is otherwise being charged). This can be an iterative process in which the modifications to the stored battery parameter continue as the vehicle is used. In one specific example, a "Cranking State Of Health" (CSOH) can be determined which is a relative indication of the ability of the battery to "crank" or actuate the starter motor of the vehicle. Another example determination is "Reserve State Of Health" (RSOH) which is a relative indication of the reserve capacity remaining in the battery. In another example embodiment, a relative battery condition is determined based upon a ratio between two quantities and as a function of a minimum threshold value of a battery parameter, a measured battery parameter value and a maximum observed value of a battery parameter value.

Turning now to a specific example embodiment of the present invention, the Cranking State Of Health (CSOH) can be calculated using Equation 2 as follows:

$$CSOH = \{[CCA\text{comp} - CCA\text{MIN}]/[CCA100SOC - CCA\text{MIN}]\} \times 100 \qquad \text{EQ. 2}$$

where CCAcomp is a compensated measured cold cranking amps of the battery, CCAMIN is a minimum cold cranking amp value which is required by the engine and starter motors to crank and CCA100SOC is the cold cranking amps when the battery is at 100 percent state of charge and 100% state of health (i.e., fully charged). CSOH is a ratio between two numbers and will range between 0 and 100 percent. The present (i.e., current), compensated CCA (CCAcomp) can be a function of average observed CCA over a time period, temperature and the current state of charge. This can initially be assumed to be a simple relationship, for example, a straight line or simple curve. Actual values for the relationship can be learned. For example, the relationship to state of charge can be a ratio between CCA100SOC and a CCA value obtained when the state of charge is significantly less than 100 percent charged. This can be through long term monitoring of the operation of the battery and engine in which the collected date is date and time stamped. Similarly, the relationship with temperature can initially be assumed but can be learned over time as a ratio CCAt1, CCAt2 where t1 and t2 are substantially different temperatures. Again, both quantities are preferably captured at approximately equivalent times during operation of the battery of vehicle. For example, one value could be captured during nighttime periods where the engine is not running to obtain a very cold value and another value could be captured during daytime while the engine is running. In general, the formula for CCAcomp can be expressed as:

$$CCA\text{comp} = CCA\text{average} \cdot f(SOC) \cdot f(T) \qquad \text{EQ. 3}$$

Similarly, a relative indication of the reserve capacity of the battery, the Reserve State Of Health (RSOC) can be expressed:

$$RSOH = \{[AH\text{Capacity} - AH\text{MIN}]/[AH100SOC - AH\text{MIN}]\} \times 100 \qquad \text{EQ. 4}$$

where AHCapacity is the present or current amp hour capacity of the battery AHMIN is the minimum acceptable amp hour capacity of the battery AH100SOC is the amp hour capacity of the battery at 100 percent state of charge (i.e., the battery is fully charged). RSOH ranges between 0 and 100 percent. Amp hour capacity is given as:

$$AHCapacity = \frac{\Delta Energy}{\Delta SOC} \qquad \text{EQ. 5}$$

Figure 4:
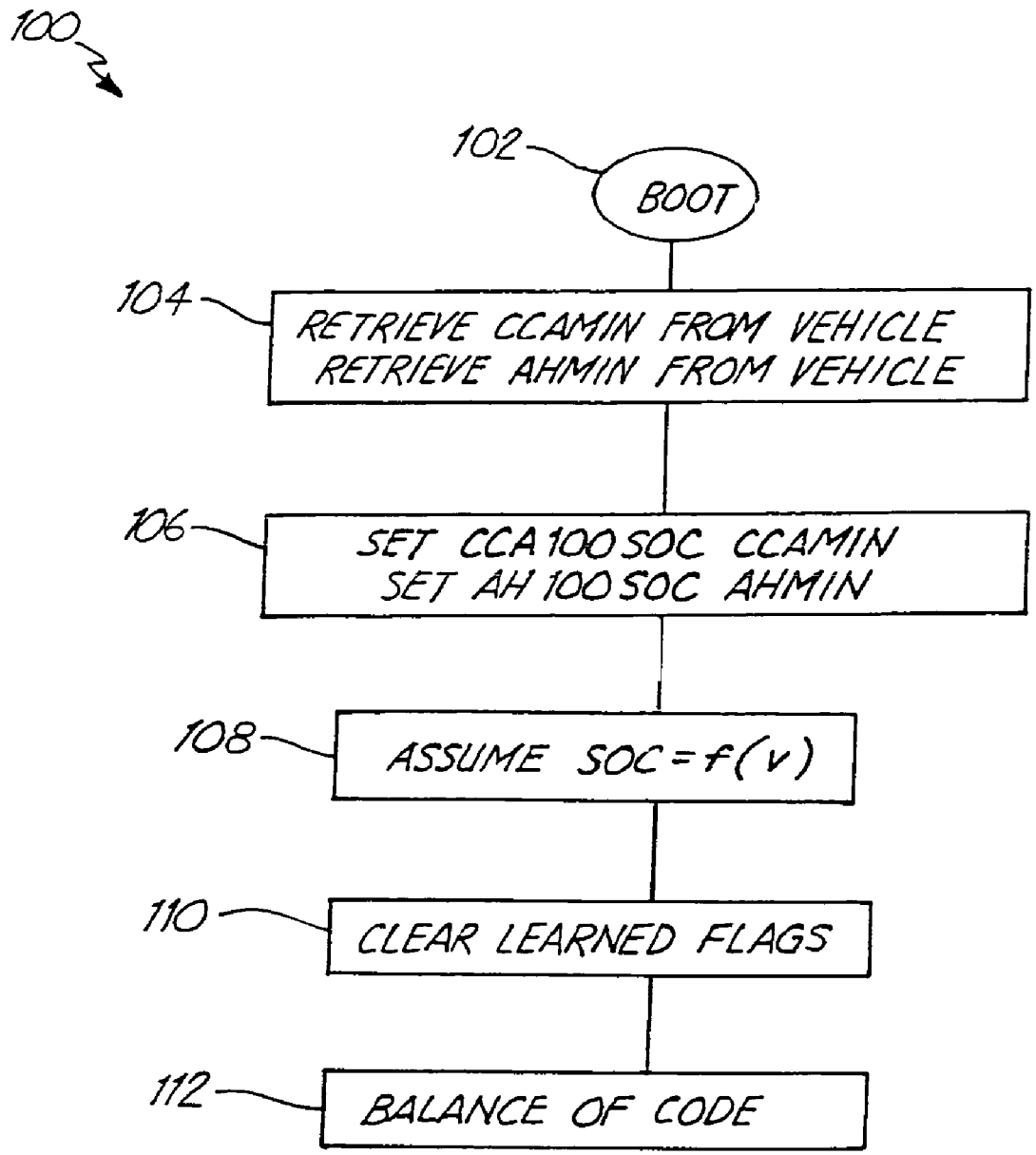
FIG. 4 is a flow chart illustrating a boot sequence in accordance with one embodiment of the invention.
Figure 5:
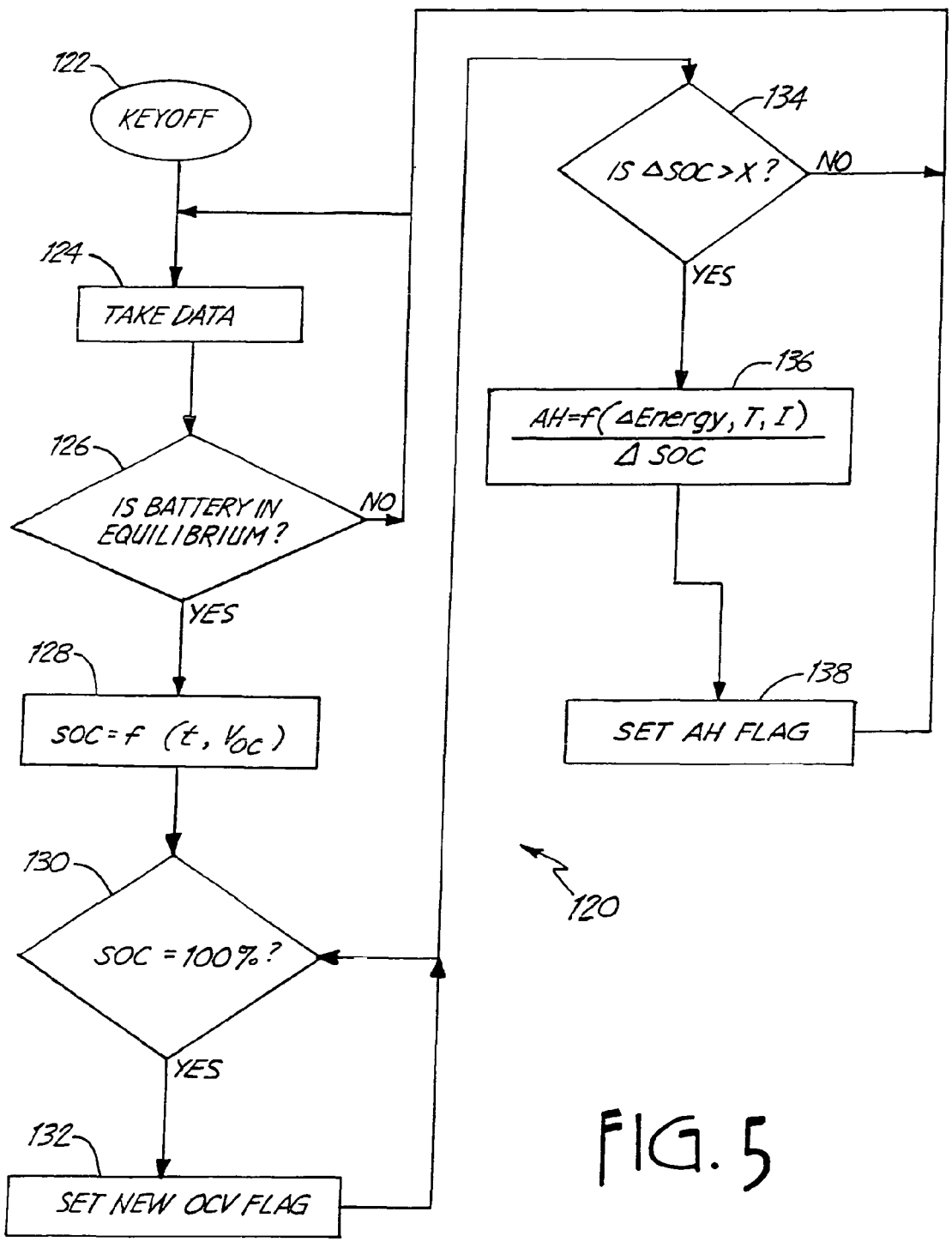
FIG. 5 is a flow charge illustrating a key off sequence of the invention.
Figure 6:
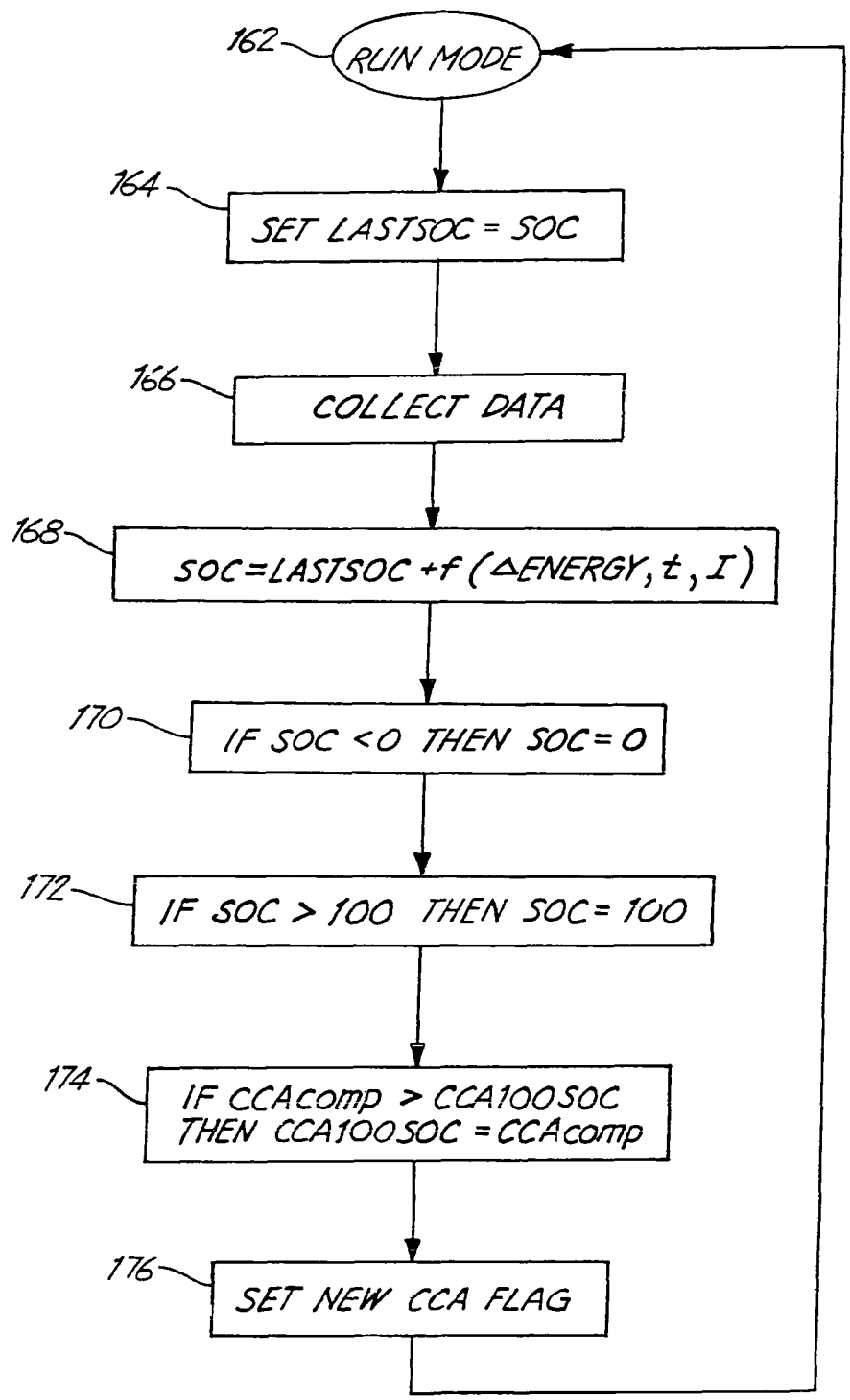
FIG. 6 is a flow chart illustrating a run mode in accordance with the invention.

Equations 2 and 4 are functions of parameters which are not necessarily initially known of a battery. One aspect of the invention includes an iterative approximation technique which is used to arrive at such parameters and which can be used in these or similar formulas. FIGS. 4, 5 and 6 are simplified block diagrams which illustrate one example technique for such estimations. Using Equation 2 as an example, CCA100SOC is initially assumed to be CCAMIN. CCAMIN can be programmed into a memory in the vehicle (such as memory 40 shown in FIG. 2) during manufacture or otherwise stored and is the minimum acceptable CCA of the battery. As the vehicle is operated, and the battery is charged and discharged, the state of charge can be monitored and a maximum observed. The CCA measurement wherein the state of charge is 100% is stored in memory and is assigned to CCA100SOC.

Turning to FIG. 4, a flow chart 100 is shown that illustrates a "boot" procedure 100. This boot procedure 100 is typically initiated any time the memory 40 has been erased or if microprocessor 22 detects that the battery 18 has been disconnected. The procedure 100 starts at start block 102. At block 104 values for CCAMIN and AHMIN are retrieved from memory within the vehicle for memory (such as memory 4). For example, this information can be permanently stored in a memory during manufacture of the vehicle or otherwise programmed. Note that the various instructions are used to implement these steps normally be stored in a memory such as memory 40 and carried out by microprocessor 22.

At block 106, values for CCA and amp hour capacity at 100 percent state of charge (CCA100SOC and AH100SOC) are said equal to CCAMIN and AHMIN, respectively. Note that this is an assumption, however, it provides a starting point for the observation process. At block 108, the state of charge is assumed to be a function of voltage. One simple function is as to relate the state of charge to the open circuit voltage:

$$SOC = 1250 \cdot V_{oc} - 1475 \qquad \text{EQ. 6}$$

At block 110, flags are cleared to indicate that the values have been "learned". At block 114, control is passed to another appropriate block such as those shown in FIGS. 5 and 6.

FIG. 5 is a simplified block diagram of a key off procedure 120. Key off procedure 120, as the name implies, occurs during periods when the engine of the vehicle is not running or the battery is not otherwise being charged. The procedure begins at block 122. At block 124, various data is obtained from the battery such as voltage, current and temperature. Block 126 causes the procedure to wait until the battery has reached an equilibrium. For example, it can be assumed that the battery is at equilibrium if the temperature and the voltage are substantially constant. Once the battery has reached equilibrium, the state of charge of the battery is determined as a function, temperature and open circuit voltage at block 128. For example, one such state of charge formula is as follows:

$$SOC = 1250 V_{oc} - 1475 + V_{TC} \qquad \text{EQ. 7}$$

At block 130, if the state of charge is determined to be 100 percent, control is passed to block 132. One technique for determining if the state of charge is at 100 percent is by observing a reduction in the amount of charge current which the battery is accepting.

At block 132, a new open circuit voltage flag is set. The flag is used to alert the program that a stable condition has been met. Additionally, at block 130, if the state of charge does not equal 100 percent, control is passed to block 134. At block 134, if the state of charge is not greater than x control is passed to block 124. X is a setable percentage which is typically selected to be between %5 and 10%. Alternatively, control is passed to block 136. At block 136, the amp hour capacity of the battery is calculated as a function of the change in energy supplied to or drawn from the battery, the temperature and the current. One example formula is:

$$AHCapacity = \frac{\Delta Energy}{\Delta SOC} \qquad \text{EQ. 8}$$

FIG. 6 is a block diagram 160 showing operation while the engine is running or the battery 18 is being charged. Flow chart 160 begins at block (where energy=AH*f(T)*f(SOC)) 162 and control is passed to block 164. At block 164, a variable LASTSOC is set to the current state of charge. At block 166, data is collected such as voltage, current, temperature and conductance. At block 168, the current state of charge is determined as the last state of charge plus a quantity which is a function of the change in energy, the temperature and the current into or out of the battery. Equation 9 can be used as follows:

$$SOC = LASTSOC + \frac{\Delta Energy}{AHCapacity} \qquad \text{EQ. 9}$$

At block 170, if the state of charge is less than 0, then the state of charge is forced to equal 0. On the other hand, at block 172, if the state of charge is greater than 100 the state of charge is forced to a value of 100. At block 174, if the compensated CCA reading is greater than CCA100SOC, then CCA100SOC is set equal to CCAcomp. At block, 176, a new CCA flag is set which is used to indicate a new CCA value has been obtained and control is returned to block 164. This procedure repeats until the engine is turned off, the battery is disconnect or the charging cycle is otherwise interrupted.

As the data is collected, the formulas set forth above are used to calculate the RSOH and the CSOH. This information can be provided in any appropriate form to an operator. For example, a normal display can be provided or a graphical form can be used. An empty/full gauge can be used to provide an output which is familiar to most drivers. A "service battery soon" indication is another example output. The values can also be used to control operation of the alternator 10 or stored for future retrieval by diagnostic equipment or to validate warranty claims.

In another aspect, a state of life (SOL) of the battery 18 is determined by microprocessor 22. The state of life provides an indication of what the current age of a battery is and can be related to the life span of the battery. For example, SOL can be an indication of present battery age relative to the total lifespan of the battery. For example, the state of life can indicate that the battery life is a certain percent spent, that a battery is a number of years old or that a battery has a certain number of years remaining in its life. Only one specific example, the reserved state of life is a function of the reserved state of health (RSOH) from equation 4 and the cranking state of health (CSOH) from equation 2. A specific relationship is as follows:

$$SOL = RSOH \cdot CSOH \qquad \text{Equation 10}$$

Various calibration factors and/or offsets or other functions can be used to manipulate Equation 10 to relate the state of life to the desired unit. The microprocessor 22, determines if the battery 18 has been replaced with a different battery. For example, microprocessor 22 can store historical information such as past measurements of a dynamic parameter of the battery 18. The past measurement can be from the previous time the vehicle was operated, from a parameter measured within the past month or longer, or from multiple parameters which were previously measured. A current or more recent measurement is then compared with the past measurement. If the percentage change is more than a predetermined amount, for example 10%, the microprocessor 22 makes a determination that a new battery 18 has been placed into the vehicle. Upon such a determination, the microprocessor can begin the learning process discussed above and update a stored parameter of the battery.

A constant offset value can be introduced prior to digitization of the current sampled by the current sensor 26. For example, referring to FIG. 2, a voltage offset can be introduced prior to the sensed current signal from sensor 26 being digitized by processor 22. This reduces the dynamic range required by the microprocessor to obtain an accurate measurement for calculating a dynamic parameter. Further, processor 22 can enter a sleep mode during periods of vehicle inactivity and can be reactivated from the sleep mode if the sensed current is at least greater than the constant offset. To various different constant offsets can be used as desired. For example, one constant offset value can be used during vehicle operation in and a second constant offset value can be used during vehicle inactivity. If the A to D conversion yields a result which is approximately 0, the processor can use the value of the constant offset and assume that it represents the actual current. When current values are integrated over time, errors due to noise or other sources are reduced.

Although the present invention has been described with reference to preferred embodiments, workers skilled in the art will recognize that changes may be made in form and detail without departing from the spirit and scope of the invention. For example, the circuitry, circuit configuration, and battery condition parameters are provided as simply example embodiments and those skilled in the art will recognize that other configurations and implementations can be used. The particular connections to the battery can be through Kelvin connections which include a "split" Kelvin connection in which the forcing function connection(s) are/is spaced apart from the battery such as that described and illustrated in U.S. patent application Ser. No. 09/431,697, filed Nov. 1, 1999 and entitled ELECTRICAL CONNECTION FOR ELECTRONIC BATTERY TESTER, now U.S. Pat. No. 6,163,156 which is incorporated herein by reference in its entirety. In a further example of the present invention, alternator 20 can comprise an electronic battery charger such as those used to charge automotive vehicles when the vehicle is stationary or to charge stand by batteries such as those used in remote systems such as cellular sites. In such an embodiment, control line 23 is used to adjust the charger of battery 18 using the techniques set forth herein. In such an embodiment, element 10 shown in FIG. 1 illustrates a standby power supply for equipment.

What is claimed is:

1. A battery monitor for use in monitoring a battery of an automotive vehicle comprising:
   a voltage sensor configured to monitor a voltage across the battery applied to an electrical system of the vehicle;
   a current sensor configured to monitor an electrical current through the battery and the electrical system of the vehicle;
   a processor configured to measure a parameter of the battery based upon the sensed current and the sensed voltage, compare the measured parameter with a historical parameter obtained from a previous measurement and responsively identify that an original battery has been removed from the vehicle and that a replacement battery has been installed based upon a result of the comparison, measuring and responsively begin a learning process to learn a state of charge of the replacement battery by monitoring current and voltage during operation of the automotive vehicle.

2. The apparatus of claim 1 wherein the replacement of the battery is identified if the measured parameter is within 10% of the historical parameter.

3. The apparatus of claim 1 wherein the historical parameter is less then one month old.

4. The apparatus of claim 1 wherein the historical parameter is from a previous time the vehicle was operated.

5. The apparatus of claim 1 wherein in response to replacement of the battery the processor updates a stored parameter of the battery.

6. The apparatus of claim 1 wherein the microprocessor determines condition of the battery as a function of the stored parameter of the battery.

7. The apparatus of claim 1 wherein the parameter comprises a dynamic parameter.

8. The apparatus of claim 1, including:
   an analog to digital converter configured to convert sensed current from the current sensor to a digital value;
   a constant offset configured to reduce a quiescent current draw from the sensed current prior to digitizing the sensed current by the analog to digital converter.

9. The apparatus of claim 8 wherein the processor enters a sleep mode during periods of vehicle inactivity and is activated from the sleep mode if current is greater than at least the constant offset.

10. The apparatus of claim 8 wherein the constant offset has a first value during vehicle operation and a second value during vehicle inactivity.

11. The apparatus of claim 8 wherein the processor integrates digitized current values over time.

12. The apparatus of claim 8 the processor uses the constant offset for calculations of the digitized current is less than a threshold.

13. The apparatus of claim 1, including:
   a communication link configured to couple to a data bus of the vehicle; and
   wherein the processor is further configured to receive a signal from the data bus indicative of operation of an electrical component of the vehicle and responsively wake up from a sleep mode to monitor the electrical current through the battery using the current sensor.

14. The apparatus of claim 13 wherein the processor re-enters the sleep mode after operation of the electrical component has terminated.

15. The apparatus of claim 13 wherein the signal indicates a door of the vehicle has opened.

* * * * *